US006242159B1

(12) United States Patent
Firth et al.

(10) Patent No.: US 6,242,159 B1
(45) Date of Patent: Jun. 5, 2001

(54) METHOD OF PREPARING A WATER-LESS LITHOGRAPHIC PRINTING FORM

(75) Inventors: Deborah Jane Firth, deceased, late of Lower Wortley, by Herbert Stuart Firth, legal representative; Mark John Spowage, Swillington; Christopher David McCullough, Sherburn-in-Elmet; Kevin Barry Ray, Mortley, all of (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/464,201

(22) Filed: Dec. 15, 1999

Related U.S. Application Data

(63) Continuation of application No. PCT/GB98/01827, filed on Jun. 22, 1998.

(30) Foreign Application Priority Data

Jun. 26, 1997 (GB) .................................................. 9713411

(51) Int. Cl.$^7$ ................................ G03F 7/30; G03F 7/021
(52) U.S. Cl. ........................ 430/303; 430/157; 430/163; 430/175
(58) Field of Search ................................... 430/303, 157, 430/163, 175

(56) References Cited

U.S. PATENT DOCUMENTS

| 3,890,149 | * | 6/1975 | Schlesinger et al. | 430/162 |
| 3,997,349 | | 12/1976 | Sanders | 430/160 |
| 4,486,529 | | 12/1984 | Jeffers et al. | 430/300 |

FOREIGN PATENT DOCUMENTS

| 2424562 | 12/1976 | (DE) . |
| 2725308 | 12/1977 | (DE) . |
| 0164128 | 12/1985 | (EP) . |
| 0625728 | 11/1994 | (EP) . |
| 0770494 | 5/1997 | (EP) . |
| 0778499 | 6/1997 | (EP) . |
| WO9707986 | 3/1997 | (WO) . |
| WO9831545 | 7/1998 | (WO) . |
| WO9832053 | 7/1998 | (WO) . |

* cited by examiner

Primary Examiner—John S. Chu
(74) Attorney, Agent, or Firm—Baker Botts L.L.P.

(57) ABSTRACT

There is described a method of preparing a water-less lithographic printing form using a precursor which includes a support having a coating thereon comprising a diazo salt formed from an aromatic diazonium compound and an abhesive counter anionic moiety, the method comprising heat mode imaging the precursor and processing the imaged percursor on press by the application of printing ink to remove the abhesive products of the imaging so that areas of the precursor which have been imaged are ink-accepting.

24 Claims, No Drawings

METHOD OF PREPARING A WATER-LESS LITHOGRAPHIC PRINTING FORM

This is a continuation of copending international application No. PCT/GP98/01827 filed Jun. 22, 1998.

This invention relates to the production of so-called waterless lithographic printing forms, especially to a method for preparing an imaged water-less lithographic printing form on press using a digitally controlled laser output and to imageable compositions for use thereon.

Currently the commonest method of preparing a lithographic printing form is to image a photosensitive lithographic printing form precursor using an image mask, such as a photographic negative, and to prepare the printing form therefrom using aqueous developing solution. This procedure is time consuming and requires facilities and equipment to support the necessary chemistry.

Thus recently, various methods have been proposed for preparing lithographic printing forms on the press which is to be used to produce prints from the printing form. These methods prepare the image using a digitally controlled laser image head. As described in E.P.A. 580393 such methods include ink-jet methods digitally controlled, spark-discharge methods and the production of electromagnetic radiation pulses that create chemicals changes of the printing form blank. Also etching methods have been described as well as blank printing forms which are ablated by the laser to form an ink-receptive image.

In addition, lithography may divided into two classes:
1) a process which requires dampening water which is fed to the non-image areas of a printing form on a press and forms a water film that acts as an ink repellent layer (this is the so-called fount solution), and
2) a process which requires no fount solution, so-called water-less lithography or driography. Most lithographic printing form presses at present are of the first type and require a fount-solution during the printing process. However, lithographic printing forms of this type suffer from a number of disadvantages. Some of these are:-
a) Adjustment of the proper ink-water balance during press operation is difficult and requires great experience. If the correct ink-water balance is not achieved, scumming is occasioned when the printed ink image extends into the non-image areas ruining the printed image.
b) Adjustment of the ink-water balance at start-up or re-start is particularly difficult and cannot be stabilised until a large number of sheets have been printed, thus incurring waste.
c) The ink tends to become emulsified which leads to poor adherence of the ink on to the printing form which causes problems in colour reproduction and dot reproduction.
d) The printing process has to be provided with a dampening system, thus increasing its size and complexity. These dampening solutions contain volatile organic compounds.
e) The printing form care chemistry and fount solutions require careful control and selection Further, printing form cleaners contain significant levels of solvent which is not desirable.

However with water-less printing (or driographic printing forms) in which the ink-releasing layer is for example, a cured silicone layer, there is no scumming and clearer images can be produced. Very often water-less printing forms comprise a base material, for example aluminium plate, on which a photosensitive layer is coated, on this photosensitive layer is coated a silicone layer. After imagewise exposure and aqueous development in which selected areas of the photosensitive composition are altered, the overlying silicone layer is removed and the printing forms inked up. The ink adheres only to the those areas of the printing forms not covered by the silicone remaining after development Thus the printing form can be used without the need to employ a fount solution.

However, water-less printing forms are often of complex design (in practice it has proved difficult to get the silicone layer composition to adhere to the photosensitive layer), which increases their cost. Moreover they require a dedicated processing system.

In spite of the idea of water-less printing forms having been described in patent specifications for at least fifteen years, very little has been done to commercialise the idea and water-less printing forms which have been and are being sold are more expensive than the conventional printing forms which require a fount solution.

In U.S. Pat. No. 3,997,349 there is described a novel type of water-less lithographic printing form which requires no post-exposure processing. In this patent specification there is described a lithographic printing form precursor which comprises coated on a support a diazonium salt formed from an aromatic diazonium compound and an abhesive perfluoroaliphatic acid or salt thereof, said acid containing at least three carbon atoms, said coating being capable of conversion from an ink abhesive surface to an ink adhesive surface merely upon exposure of said coating to an imagewise pattern of actinic radiation without further treatment thereof the dry coating weight of said coating being sufficient to provide free abhesive acid only in exposed areas which can be displaced by driographic ink whereby said ink deposits in only exposed areas in a negative acting driographic system.

It is suggested in U.S. Pat. No. 3,997,349 that upon light exposure of the light-sensitive diazonium salt to actinic radiation, the diazonium bond between the anionic abhesive moiety and the aromatic moiety is broken. There is probably some nitrogen gas produced, along with some complex organic matter and free abhesive acid. While there may be a minor amount of chemical coupling between the free abhesive acid and the ring structure of the aromatic moiety, the major effect of exposure is to change the composition from a hard crystalline solid with a high melting point to a two-phase material containing a low molecular weight abhesive component overlying a hard decomposition product or organic cap of the aromatic diazonium nuclei. This hard decomposition product or organic cap from the diazonium nuclei is adhesive, i.e. ink receptive. The free abhesive acid thought to be formed in accordance with this exposure mechanism overlies the ink receptive organic cap and can be easily displaced by driographic ink upon inking of the surface.

We have now discovered that the preferred diazorium compounds as set forth in U.S. Pat. No. 3,997,349 are useful in a heat mode imaging process to prepare a waterless lithographic printing form.

In addition, we have discovered novel methods of preparing a water-less printing form using the preferred diazonium compounds as set forth in U.S. Pat. No. 3,997,349, which are exposed in a heat mode imaging process using an imaging head which is attached to the press.

According to one aspect of the present invention, there is provided a method of preparing a water-less lithographic printing form using a precursor which includes a support having a coating thereon comprising a diazo salt formed from an aromatic diazonium compound and an abhesive counter anionic moiety, the method comprising heat mode imaging the precursor and processing the imaged precursor on press by the application of printing ink to remove the abhesive products of the imaging so that areas of the precursor which have been imaged are ink-accepting.

Preferably the abhesive counter anionic moiety is a perfluoroaliphatic acid. Another useful abhesive counter anionic moiety is a trimethylsilanolate.

The preferred aromatic diazonium compound of use in the present invention has the formula:-

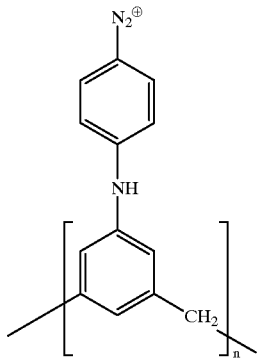

n = 1–11

The preferred diazo salt of use in the present invention and which is used in the examples has the formula:-

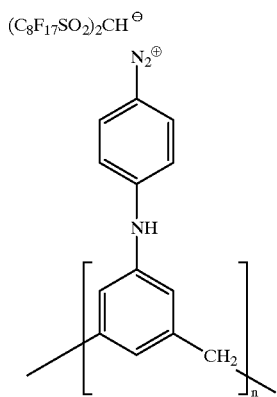

n = 1–11

It is hereinafter referred to as Diazo A.

The support may be a material suitable for use on a waterless lithographic press. The base which can be used as the support is usefully an aluminium base which has undergone the usual treatments well known in the lithographic art for enabling a radiation sensitive composition to be coated thereon. Other suitable metal supports are chromium or steel.

Another base material which may be used in the method of the present invention is a plastics material base or a treated paper base as used in the photographic industry. A particularly useful plastics material base is polyethylene terephthalate. Also a so-called resin coated paper which has been corona discharge treated can also be used. Metallised polyethylene terephthalate is also a useful base.

According to a preferred method of the present invention the heat-mode imaging is carried out by use of a laser which is controlled by an image stored in a computer. In this case most preferably a radiation absorbing compound is associated with, preferably present in, the coating which absorbs at the output wavelength of the laser.

Preferably the laser emits at above 600 nm, that is to say it emits IR radiation. The IR radiation absorbing compound is usefully carbon such as carbon black or graphite. It may be a commercially available pigment such as Heliogen Green as supplied by BASF or Nigroine Base NG1 as supplied by NH Laboratories Inc or Milori Blue (C.I. Pigment Blue 27) as supplied by Aldrich.

According to a preferred embodiment of the present invention the precursor is imagewise exposed directly by a laser emitting radiation at above 600 nm and the radiation absorbing compound is usefully an infra-red absorbing dye.

Preferably the infra-red absorbing compound is one whose absorption spectrum is significant at the wavelength output of the laser which is to be used in the method of the present invention. Usefully it may be a dye or a pigment of the squarylium, merocyanine, cyanine, indolizine, pyrilium or metal dithioline classes.

Examples of such compounds are Dye A:-

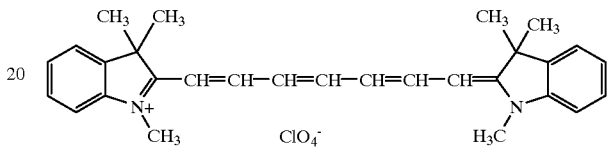

and Dye B

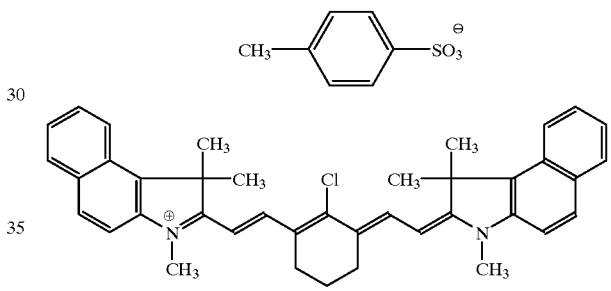

and Dye C, KF654B PINA as supplied by Reidel de Haen UK, Middlesex, England, believed to have the structure:

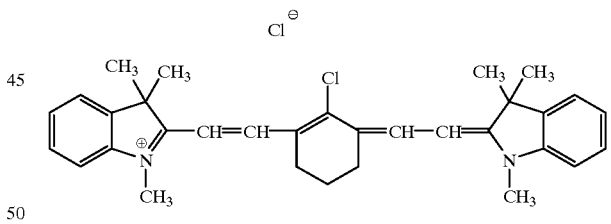

Examples of lasers which can be used in the method of the present invention include semiconductor diode lasers emitting at between 600 nm and 1100 nm. An example is the Nd YAG laser which emits at 1064 nm, but any laser of sufficient imaging power (whose radiation is absorbed by the composition), can be used.

Suitably the radiation absorbing compound constitutes at least 1%, preferably at least 2%, preferably up to 25%, more preferably up to 15%, of the total weight of the composition. Thus a preferred weight range for the radiation absorbing compound may be expressed as 2–15% of the total weight of the composition. Likewise there may be more than one radiation absorbing compound. References herein to the proportion of such compounds are to their total content.

In some cases when an infra-red dye is present in the coating composition, it colours the composition. However in the heated areas after exposure, this colour darkens and thus the heated areas are visually distinguished from the unheated areas.

In addition materials which absorb lower-wavelength radiation, e.g. 488 nm radiation from an Ar-ion source, may be used be utilised to convert the radiation to heat.

According to another aspect of the present invention, the precursor may be imagewise heated using a heated body. For example, the precursor, either the reverse face or, preferably the heat sensitive composition, may be imagewise contacted by heat stylus.

According to a further aspect of the present invention there is provided a method of preparing a water-less printing form by heat mode imaging said precursor in situ by imaging means mounted on the press then processing the imaged precursor on the press by the application of water-less printing ink. Application of the ink from the press ink-train to the support removes the abhesive products of the exposure so that the areas of the precursor which have been heated are ink-accepting.

According to a preferred embodiment of the present invention, the heat mode imaging device is a digital laser imaging head which is in essence an image setter attached to the printing press and comprises a laser which scans in an imagewise manner radiation across precursor in response to image signals stored in a computer.

According to a further aspect of the present invention the method of the present invention is carried out in situ in a printing press. Thus the support which is inserted into the printing press is coated with a predetermined thickness of diazonium compound, the support cylinder is disengaged from the roller drive of the printing press and is caused to rotate at a speed suitable for imaging, the digital imaging head attached to the printing press images the coating on the support, after imaging the support cylinder is re-engaged to the roller drive of the printing press and the rollers of the press rotate, are inked up, and apply water-less ink to the coated support thus removing the abhesive products of the exposure so that areas of the precursor which have been heated are ink-accepting and the printing press prints on to paper fed to it. After the print run has finished a printing form washer can be employed to remove all the coating from the support which can then be re-used.

In a preferred embodiment of this aspect of the present invention details of the required film thickness to be coated on the support are fed directly into the laser imaging head which is programmed to adjust scanning speed to provide the optimum cure and imaging resolution. Some advantages of the proposed method of the present invention are that only the diazonium coating thickness necessary to do the job need be employed which in turn means scanning speed and hence recording time is minimised. This means for this system that make ready time is directly proportional to run length which is exactly what is required for a Direct-to-Press system, i.e. make ready time reduces as run length reduces in cases where imaging power is constant.

A preferred method of this aspect of the present invention uses a metal support in the form of a sleeve or cylinder which fits onto the press cylinder.

In methods using a metal sleeve it is preferred that is this can be removed from the press to clean it thoroughly and also to renew it periodically. The idea of a removable sleeve is beneficial in case the surface becomes damaged and a spare can be used.

A preferred method for the use of flexible supports is to have a roll of the support within the press which when new material is required, dispenses the new support and recoils the used support automatically. In such a system, all operations are carried out in-situ on the press with the exception of occasional renewal of the roll of support material.

In a further aspect of the present invention the support may comprise an additional layer comprising a radiation absorbing compound. This multiple layer support can provide routes to high sensitivity as larger quantities of absorber can be used without affecting the function of the image forming layer Therefore, if the method of the present invention is carried out in situ on the press, this additional layer may be already present in the sleeve, cylinder or flexible support prior to coating and exposure of the composition comprising essentially a diazo salt. In principle any radiation absorbing material which absorbs sufficiently strongly in the desired wavelength range can be incorporated or fabricated in a uniform coating. Dyes, metals and pigments (including metal oxides) may be used in the form of vapour deposited layers, techniques for forming and use of such films are well known in the art, for example in EP 0,652,483.

In one method of the invention film-forming polymeric binders may be included in the coating composition. The inclusion of such binders has been found to increase the oleophilicity of the heated areas of the precursor and allows a thicker layer to be employed. Suitable polymeric binders include polyurethanes, epoxy resins and polyvinylpyrolidinone.

In another method of the present invention there is included in the coating composition a white light absorbing compound. The coated precursor used in the present invention is UV sensitive and the non-heated areas remain so even after the plate has been inked up. Thus white-light fogging where the light comprises a UV component would occur and some ink will be picked-up in the fogged areas.

Suitably the white light absorbing compound constitutes at least 1%, preferably at least 2%, preferably up to 50%, more preferably up to 25%, most preferably up to 10% of the total weight of the composition. Thus a preferred weight range for the white light absorbing compound may be expressed as 2–15% of the total weight of the composition.

Examples of useful white-light absorbers are Uvasorb 3C an optical brightening agent and 4- (phenylazo) diphenylamine a yellow dye.

It has been shown that the presence of the white-light absorbers in the coating composition does not affect the sensitivity of the precursor to heat-mode imaging.

The invention extends to a method of preparing a water-less lithographic printing form which comprises coating on a support a coating comprising essentially a diazo salt formed from an aromatic diazonium compound and an abhesive counter anionic moiety, heat mode imaging the coated support by direct digital imagewise application of radiation and processing the plate on press by the application of printing ink to remove the abhesive products of the exposure so that the areas of the plate which have been imagewise exposed are ink-accepting.

The invention extends to a novel precursor as described in any statement herein.

The invention extends to a printing form prepared in a method as described in any statement herein.

Any feature of any aspect of any invention or embodiment described herein may be combined with any feature of any aspect of any other invention or embodiment described herein.

The following examples more particularly serve to illustrate the various aspects or the present invention described hereinabove.

Testing sensitivity of coatings

The coated substrate to be imaged was cut into a circle of 105 mm diameter and placed on a disc that could be rotated at a constant speed between 100 and 2500 revolutions per minute. Adjacent to the spinning disc a translating table held the source of the laser beam so that the laser beam impinged normal to the coated substrate, while the translating table moved the laser beam radially in a linear fashion with respect to the spinning disc.

The laser used was a single mode 830 nm wavelength 200 mW laser diode which was focused to a 10 micron resolution. The laser power supply was a stabilised constant current source.

The exposed image was in the form of a spiral whereby the image in the centre of the spiral represented lower laser scanning speed and long exposure time and the outer edge of the spiral represented fast scanning speed and short exposure time. Imaging energies were derived from the measurement of the diameter at which the image was formed.

Starting Materials

The following products are referred to hereinafter:

Perfluorooctyl diazo A—prepared as described in U.S. Pat. No. 3,997,349 using perfluoro-1-octane sulfonic acid, tetraethylammonium salt as supplied by Aldrich chemical company of Dorset, England and diazo LDN-2 sulfate, a condensation product of diphenylamine-4-diazonium sulfate and formaldehyde as supplied by Varichem Co Ltd of Brynmawr, Wales.

Planfoil polyester montage foil (0.18 mm thickness) as supplied by Horsell of Leeds, England.

SER 910 epoxy, which is Stag Epoxide Resin 910 as supplied by Astor Stag Ltd of Middlesex, England.

Uvasorb 3C as supplied by 3V U.K. Ltd of Cheshire, England.

All other chemicals and solvents used in the processes were supplied by Aldrich Chemical company of Dorset, England.

EXAMPLE 1.

Without IR dye.

Perfluorooctyl diazo A (0.2 g) was added to acetone (5 ml) followed by mixing. When a complete solution was attained, methanol (95 ml) was added. This prepared solution (1 ml) was coated onto planfoil polyester montage foil and dried at 80° C. for 2 minutes to give a coating film weight of $0.6 gm^{-2}$. Plates were imaged on the exposure apparatus just described. After exposure, the plates were inked up with a rubber roller and water-less ink to give a plate with an image area and a non-image release area. The imaging energy density required to give a suitable image was 5000 $mjcm^{-2}$.

EXAMPLE 2.

With IR dye.

Perfluorooctyl diazo A (10 g) and IR dye B (0.4 g) were added to dimethylformamide (89.6 g) followed by mixing. This solution (1 ml) was coated onto
1) planfoil polyester montage foil (0.18 mm thickness) and
2) standard Al substrate.

Each composition was dried at 80° C. for 2 minutes to give a coating film weight of 0.6 $gm^{-2}$. The plates were imaged on the exposure apparatus as just described. After the IR exposure the plates were inked up with a rubber roller and water-less ink to give a plate with an image area and a non-image release area. The imaging density required to provide a good image was 150 $mJcm^2$.

EXAMPLE 3

| With Epoxy added. | TEST 1 | TEST 2 |
|---|---|---|
| IR dye B | 0.4 g | 0.4 g |
| Perfluorooctyl diazo A | 10 g | 7 g |
| SER 910 Epoxy | — | 3 g |
| Solvent Blend | 90 g | 90 g |
| Solvent Blend | = Acetone | 65% w/w |
|  | Diacetone alcohol | 25% w/w |
|  | N-methyl pyrolidone | 10% w/w |
| TEST 2 Coated down with WHITE bar, Film weight = 0.22 $gm^2$ | | |
| Coated down with YELLOW bar, Film weight = 0.33 $gm^2$ | | |
| TEST 1 Coated down with WHITE bar, Film weight = 0.22 $gm^2$ | | |

TEST 1, white bar contains the same amount of active diazo compound as example 2 coated down with yellow bar.

Plates were coated onto a grained Al plate and dried at 80° C. for two minutes. Plates were imaged on the Creo Trendsetter (an I.R. exposure apparatus).

The imaging energy density required to give a suitable image was 400 $mJcm^{-2}$ (in both cases).

Plates from Test 2, satisfactorily inked in, in the exposed imaged areas within 15 revolutions of the press plate cylinder (Heidelberg Kord 64).

Plates from Test 1, inked in, in the exposed image areas within 40 revolutions. Thus, the addition of a polymeric binder into the composition has improved the ink-accepting nature of the composition.

EXAMPLE 4 TO 6.

Three series of coated compositions were prepared. In all cases diazo A were added to a mixed solvent which comprised acetone 65%w/w, diacetone alcohol 25%w/w and N-methyl-2-pyrolidone 10%w/w.

| Example 4, Standard | |
|---|---|
| Perfluorooctyl compound | 9.96% w/w |
| Dye B | 0.40% w/w |
| Solvent blend | 89.64% w/w |
| Example 5, Yellow Dye Only | |
| Perfluorooctyl compound | 5.04% w/w |
| Dye B | 0.40% w/w |
| Solvent blend | 89.56% w/w |
| 4-(phenylazo)diphenylamine | 5.00% w/w |
| Example 6, Yellow Dye and Optical Brightening Agent. | |
| Perfluorooctyl compound | 5.04% w/w |
| Dye B | 0.40% w/w |
| Solvent blend | 89.56% w/w |
| 4-(phenylazo)diphenylamine | 2.50% w/w |
| Uvasorb 3C | 2.50% w/w |

Plate Coating.

All plates were prepared by applying solution to a grained plate with a white wire bar to give a dry filmweight of 0.2 to 0.6 $gm^{-2}$. Plates were dried in an oven at 80° C. for 2 minutes.

Lightframe Fogging—15000Lux.

Plates were exposed (artificially fogged) on a Montakop UV lightframe at 20:20 vacuum with an area masked for 3,6,12,25 and 100 units.

Plates were inked with water-less ink using a hand roller. It was found that example 5 had fogged less than the example 4. In addition, example 6 had also inked up less than example 4.

Daylight Fogging—6000Lux.

Plates were exposed (artificially fogged) by placing them face up on a windowsill for 3 to 10 hours. An area was masked.

Plates were inked with water-less ink using a hand roller. It was found that example 5 had fogged less than example 4. Also, example 6 had fogged the least.

White Fluorescent Light—2000 Lux.

Plates were exposed (artificially fogged) by placing them face up underneath a white fluorescent light for 6 hours. An area was masked.

Plates were inked with water-less ink using a hand roller. It was found that example 5 had fogged less than the example 4. The masked area of example 5 also remained cleaner than example 4 on inking.

Thermal Imaging.

Plate samples from examples 4 to 6 were imaged on the I.R. exposing apparatus with an imaging energy density of 400 mJcm$^{-2}$ in order to determine whether the incorporation of the anti-fogging additives affected the ability of the plate samples to be imaged thermally.

It was found that all plates performed well.

All of the features disclosed in this specification (including any accompanying claims, abstract and drawings), and/or all of the steps of any method or process disclosed, may be combined in any combination, except combinations where at least some of such features and/or steps are mutually exclusive.

Each feature disclosed in this specification (including any accompanying claims, abstract and drawings), may be replaced by alternative features serving the same, or equivalent or similar purpose, unless expressly stated otherwise Thus, unless expressly stated otherwise, each feature disclosed is one example only of a generic series of equivalent or similar features.

The invention is not restricted to the details of the foregoing embodiments). The invention extends to any novel one, or any novel combination, of the features disclosed in this specification (including any accompanying claims, abstract and drawings), or to any novel one, or any novel combination, of the steps of any method or process so disclosed.

What is claimed is:

1. A method of preparing a water-less lithographic printing form using a precursor which includes a support having a coating thereon comprising a diazo salt formed from an aromatic diazonium compound and an abhesive counter anionic moiety, the method comprising heat mode imaging the precursor and processing the imaged precursor on press by the application of printing ink to remove the abhesive products of the imaging so that areas of the precursor which have been imaged are ink-accepting.

2. A method according to claim 1 wherein the abhesive counter anionic moiety is a trimethylsilanolate.

3. A method according to claim 1 wherein the abhesive counter anionic moiety is a perfluoroaliphatic acid.

4. A method according to claim 1, wherein the aromatic diazonium compound is of the formula:

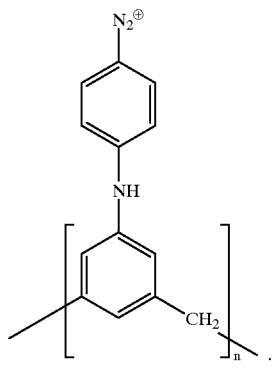

n = 1–11

5. A method according to claim 1, wherein the diazo salt is of the formula:

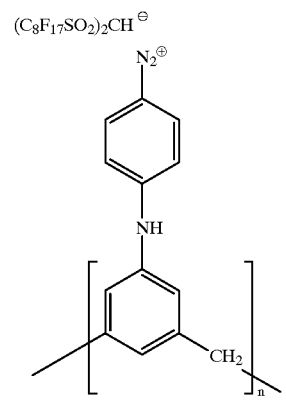

n = 1–11

6. A method according to claim 1, wherein the support is a treated aluminium base, a plastics material base or a resin coated paper base.

7. A method according to claim 6 wherein the plastics base is polyethylene terephthalate.

8. A method according to claim 1, wherein said precursor is imaged by direct digital imagewise application of radiation.

9. A method according to claim 1, wherein the coated support is imagewise heated using a laser.

10. A method according to claim 1 wherein the laser emits at above 600 nm.

11. A method according to claim 1, wherein the coating comprises a radiation absorbing compound.

12. A method according to claim 11 wherein the radiation absorbing compound absorbs radiation above 600 nm.

13. A method according to claim 10, wherein the radiation absorbing compound is an organic pigment or dye.

14. A method according to claim 13, wherein the organic pigment or dye is of the squarylium, merocyanine, cyanine, indolizine, pyrilium or metal dithioline classes.

15. A method according to claim 11, wherein is the radiation absorbing compound is carbon black or graphite.

16. A method according of claim 1, wherein the precursor is imagewise heated using a heated body.

17. A method according to claim 1, wherein the imaging is carried out in situ in a printing press.

18. A method according to claim 1, wherein the method as claimed is carried out in situ in a printing press.

19. A method according to claim 1, wherein the support is a sleeve or a cylinder which fits onto the printing press.

20. A method according to claim 1, wherein the support comprises a layer of radiation absorbing material.

21. A method according to claim 1, wherein the coating comprises a film-forming polymeric binder.

22. A method according to claim 21, wherein the polymeric binder is selected from a polyurethane, epoxy resin and polyvinylpyrolidinone.

23. A method according to claim 1, wherein the coating comprises a white light absorbing compound.

24. A method according to claim 23, wherein the white light absorbing compound is an optical brightening agent or a yellow dye.

* * * * *

UNITED STATES PATENT AND TRADEMARK OFFICE
CERTIFICATE OF CORRECTION

PATENT NO. : 6,242,159 B1
DATED : June 5, 2001
INVENTOR(S) : Firth et al.

It is certified that error appears in the above-identified patent and that said Letters Patent is hereby corrected as shown below:

Title page,
Item [57], ABSTRACT, line 7, "percursor" should read -- precursor --

Column 2,
Line 51, "diazorium" should read -- diazonium --

Column 4,
Line 3, "Nigroine" should read -- Nigrosine --

Column 6,
Lines 26-27, "polyvinylpyrolidinone" should read -- polyvinylpyrrolidinone --

Column 7,
Line 51, "mjcm$^{-2}$." should read -- mJcm$^{-2}$ .--
Line 67, "mJcm$^{2}$." should read -- mJcm$^{-2}$ .--

Column 8,
Line 11, EXAMPLE 3, Table: "pyrolidone" should read -- pyrrolidone --
Lines 11, 12 and 13, EXAMPLE 3, Table: "gm$^{2}$" (three occurrences) should read -- gm$^{-2}$ --
Line 34, "-pyrolidone" should read -- -pyrrolidone --

Column 10,
Line 60, "is" should be deleted

Column 11,
Line 9, "polyvinylpyrolidinone" should read -- polyvinylpyrrolidinone --

Signed and Sealed this

Twenty-first Day of May, 2002

Attest:

JAMES E. ROGAN
*Director of the United States Patent and Trademark Office*

*Attesting Officer*